United States Patent [19]
Donovan et al.

[11] Patent Number: 5,949,824
[45] Date of Patent: *Sep. 7, 1999

[54] TWO CONNECTOR SIMM FORMAT INTERFACE CIRCUIT

[75] Inventors: Hans Donovan, Mount Airy, Md.; Thomas R. Hicks, Cranberry Twp, Pa.

[73] Assignee: Hughes Electronics Corporation, El Segundo, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/604,121

[22] Filed: Feb. 20, 1996

[51] Int. Cl.⁶ ...................................................... H04B 3/00
[52] U.S. Cl. ............................................................ 375/257
[58] Field of Search .................................... 375/222, 257, 375/377; 439/620; 361/686, 728, 736, 737; 395/309

[56] References Cited

U.S. PATENT DOCUMENTS

| | | | |
|---|---|---|---|
| 3,843,834 | 10/1974 | Burke | 370/284 |
| 4,475,175 | 10/1984 | Smith | 395/186 |
| 4,603,320 | 7/1986 | Farago | 361/686 |
| 4,607,170 | 8/1986 | Wickman | 375/377 |
| 4,607,379 | 8/1986 | Marshall, Jr. et al. | 375/377 |
| 4,686,506 | 8/1987 | Farago | 375/377 |
| 5,030,115 | 7/1991 | Begnier et al. | 439/108 |
| 5,211,568 | 5/1993 | Yamada et al. | 439/157 |
| 5,264,958 | 11/1993 | Johnson | 395/309 |

*Primary Examiner*—Tesfaldet Bocure
*Attorney, Agent, or Firm*—John T. Whelan; Michael W. Sales

[57] ABSTRACT

A SIMM format printed circuit board with a data terminal equipment and a data communication equipment interface. The connectors for each interface have independent pin assignments. The pin assignments are arranged such that for every signal received on a pin on one connector, the corresponding signal is transmitted on a same-numbered pin on the other connector. Resultingly, the data terminal equipment and data communication equipment interfaces have common line driver/receivers.

3 Claims, 2 Drawing Sheets

5,949,824

TWO CONNECTOR SIMM FORMAT INTERFACE CIRCUIT

BACKGROUND OF THE INVENTION

In computer network systems having data communications equipment, a variety of interfaces are typically necessary to support the users, sub-networks and networks in the system. Multiple pin connectors implementing Single In-Line Memory Modules (SIMMs) on format printed circuit boards have typically been used to support the different interfaces in such networks. Line driver/receivers on the printed circuit boards perform the voltage conversions necessary for network equipment to communicate. Because the various interfaces to be supported have different electrical characteristics, generally only one type of interface can be supported per connector.

Two of the most common types of interfaces known in the art are those used to support data terminal equipment (DTE), and data communications equipment (DCE) such as modems. While there are various vendors for both DTE and DCE interfaces, the connectors on both interfaces have been standardized to ensure that different vendors' equipment can share the same environment without the need for special adapters. Because many systems must support both terminals and communications equipment, it is highly desirable that interface connections be flexible.

There are several methods known in the art which allow a user to alternate between a DCE or DTE interface, depending on the needs of the user. One device known in the art uses a custom cable that connects via straps to an intermediate connector from a standard connector. The custom cable connector is typically adapted to fit either a DTE or a DCE interface connection, but not both, therefore requiring the user to manually alternate between one or the other.

Another method known in the art implements a number of jumper straps, or shorting straps as they are known in the art, as a way to mechanically change connections over from one interface type to another. The shorting straps work in conjunction with associated headers which allow for the shorting strap to physically connect to a standard external interface connector. The shorting straps connect on the printed circuit board between the external interface connector and the line driver/receiver circuitry, and between the line driver/receiver circuitry and the serial communication controllers. The connection to the serial communication controller allows for selection of either the DTE or DCE signal configuration.

The custom cable and shorting strap methods have several drawbacks. First, the cable and the straps are unreliable when exposed to vibration, as there are typically no latches to hold them in place. Also, the straps associated with both methods take up considerable space on a printed circuit board or other medium supporting the standard interface connector. Cost is also a problem, particularly in the case of the shorting straps, where three shorting straps are required to handle a single differential signal.

Also, neither prior art method is particularly flexible in allowing for different interface connections. In the case of the custom cable, a different custom cable will be necessary to support a different interface. Where the shorting straps are concerned, at least fifteen straps must be changed to convert a DCE serial interface port to a DTE serial interface port.

For the above-described interface connector systems, as with most data and communication hardware, there is a premium on increased system flexibility, decreased cost and reduced hardware requirements.

Accordingly, this invention achieves an improved interface connector method wherein a single connector module can support both DTE interface and DCE interface configurations.

SUMMARY OF THE INVENTION

The features and advantages of the present invention are achieved in a Single In-Line Memory Module (SIMM) format printed circuit board with connectors to support both a DTE interface and a DCE interface. The invention eliminates the need for the configuration of any extra hardware, such as shorting straps. One connector on the SIMM supports the DTE signal configuration and the other connector supports the DCE configuration. One advantage of the present invention is that it is not prone to faulty connections due to vibration and is therefore more reliable than the prior art methods. Also, because the present invention eliminates the need for cables, straps and associated headers, the resulting circuitry has reduced component count, circuit board area and manufacturing cost.

More particularly, the method and apparatus of the present invention provides a SIMM with connectors for DTE and DCE interfaces respectively on each long edge of a printed circuit board. The pin assignments of the connectors are arranged such that for every signal received on a pin on one connector, a corresponding signal is transmitted on the other connector via a pin having the same number. In the case of differential signals, the pin numbers for the receiving pair of pins are the same as the pin numbers for the transmitting pair of pins. This approach allows the same line driver and receiver circuitry to be used for various signals in the DTE and DCE modes, thereby creating further economies.

BRIEF DESCRIPTION OF THE DRAWINGS

Embodiments for providing these and other interface connecting capabilities in accordance with the invention can best be understood by referring to the accompanying drawings where.

DETAILED DESCRIPTION OF THE INVENTION

Figure 1:
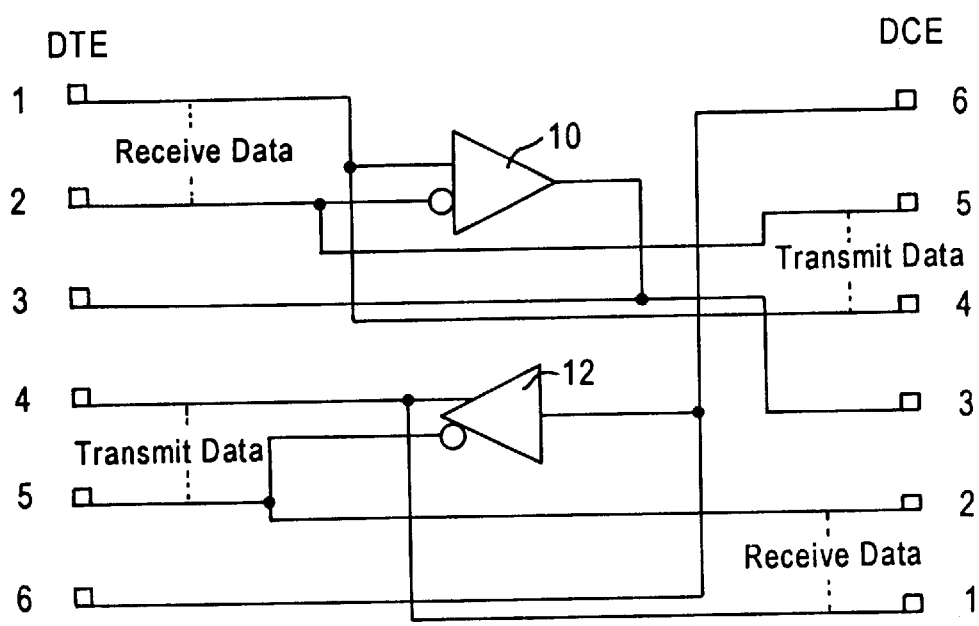
FIG. 1 is a schematic for a single transmit/receive interface connector signal pair for data terminal and data communication equipment in accordance with the principles of the present invention.

FIG. 1 is a schematic illustrating the transmitter and receiver circuitry for an interface connector signal pair in accord with the principles of the present invention. The line driver/receivers 10 and 12 shown in FIG. 1 are used to support both data terminal equipment (DTE) and data communication equipment (DCE) interfaces. The device that accomplishes this uses a SIMM format printed circuit board with two connectors, one connector on each long edge. Both connectors have an independent set of pins. The pin assignments of the device are such that for every signal (e.g. Transmit Data and Receive Data) that is received on a pin on one connector, the corresponding signal is transmitted on the other connector on a same-numbered pin. This also holds true for differential signals, with the pair of pin numbers on both connectors being the same for corresponding differential signals. This allows the same line driver or receiver to be used for corresponding signals whether in the data terminal equipment or data communication equipment mode.

Still referring to FIG. 1, an example of a transmit/receive pair is shown where the present invention is configured as a DTE and a differential signal (e.g. Transmit Data signal) is transmitted on SIMM pin 4 and SIMM pin 5 from line driver/receiver 12. Also in the DTE configuration, a Receive Data signal is received on SIMM pin 1 and SIMM pin 2 of line driver/receiver 10 in the DTE mode. In the DCE configuration, by flipping the SIMM, the Transmit Data signal is received on SIMM pin 4 and SIMM pin 5 and the Receive Data signal is transmitted on pins 1 and 2 from line driver/receiver 12.

Figure 2A:
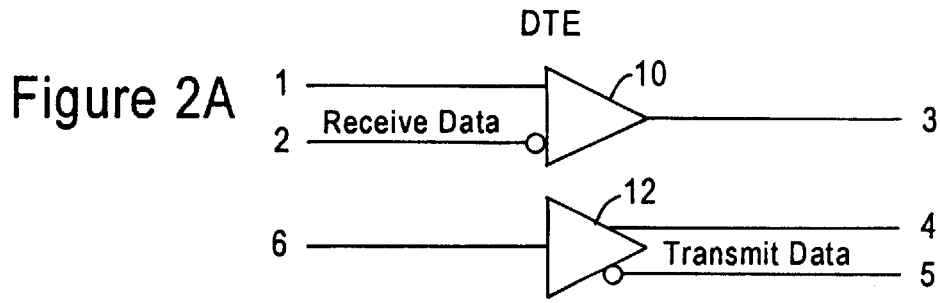
FIG. 2A and 2B is a schematic of the same circuitry as in FIG. 1 with the interface connectors for the data terminal and data communication equipment shown separately in accord with the principles of the present invention.
Figure 2B:
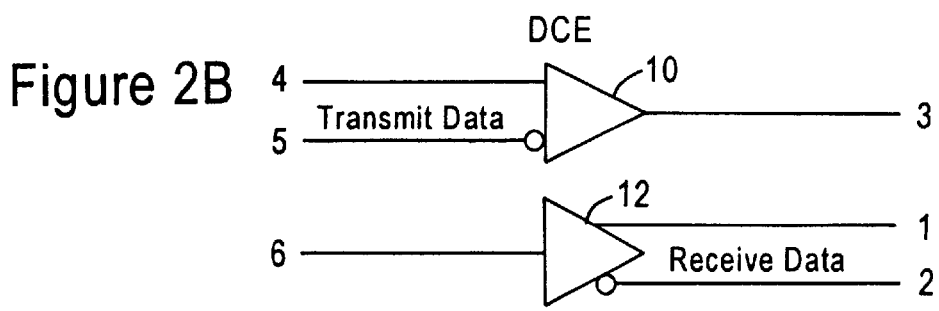

FIG. 2A and 2B shows the same circuitry as FIG. 1, but with each connector shown separately. From FIG. 2A and 2B it is clear that for the DTE and DCE configurations, the pin assignments are such that for a particular signal that is received on a pin on one connector, the corresponding signal is transmitted on the other connector on the same pin number. In the DTE mode, for instance, the Receive Data signal is received on pins 1 and 2 and in the DCE mode the Receive Data signal is transmitted on pins 1 and 2. Similarly, in the DTE mode the Transmit Data signal is transmitted on pins 4 and 5, and in the DCE mode the Transmit Data signal is received on pins 4 and 5. The same line driver/receivers 10 and 12 can therefore be used to handle the parallel signals (e.g. Transmit and Receive Data) for the DTE and DCE mode operations.

Figure 3:
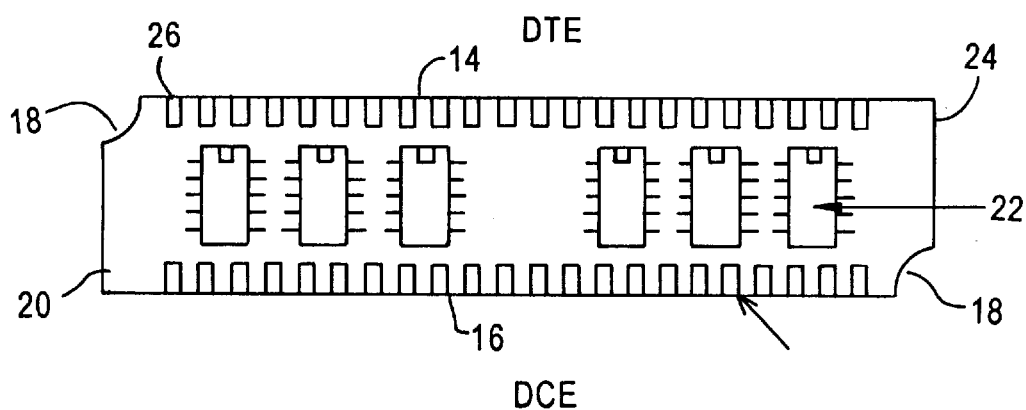
FIG. 3 is an illustration of a two connector interface according to a preferred embodiment of the present invention.

FIG. 3 is a general diagram of the two connector interface 24. The printed circuit board 20 has a DTE connector 14 and a DCE connector 16 on each long edge. There is a polarizing notch 18 on opposite ends of the printed circuit board 20 to prevent the device from being inserted incorrectly when used with other interfaces. A number of line driver/receiver circuits 22, of a kind well known in the art, are soldered onto the printed circuit board.

In an exemplary operation, the present invention will operate with a network of computer terminals and other equipment such as modems and printers. The two connector interface 24 will support connections between computers or between computers and other network equipment via the data terminal or data communication interfaces. Implementation of the two connector interface 34 allows the same lines that connect to a computer to, as the operator desires, bridge over in the alternative to another computer, to data equipment or to a different network.

Computer terminal interfaces operate within logic levels represented by a range of voltages (e.g. 0 to 5 volts). Not all external interfaces, however, operate within the same voltage level ranges. Accordingly, the line driver/receivers 22 of the present invention perform the conversions between different sets of voltage levels so that computers can talk to various computers or network equipment.

The method and apparatus of the present invention provides a SIMM format printed circuit board with connectors for DTE and DCE interfaces. The printed circuit board has polarizing notches 18 on opposite ends of the board to prevent improper insertion of the device into various interfaces. A user may connect to the device in the DTE or DCE mode, depending on the user's needs. The output of a single designated pin 26 on either connector, can be read by a microprocessor or equivalent device to determine what type of equipment is being emulated, DTE or DCE. In the preferred embodiment, in the DTE mode, the output of the designated pin 26 floats and appears like a binary "1" to the reading device. When the connector is turned around to connect in the DCE mode, the output of the designated pin 26 is connected to a grounded pull-up resistor which appears as a binary "0" to the reading device. Thus, the correct meaning of the received signals from a computer or other network equipment device can be properly processed.

During operation, for every signal that is received on a pin on one connector, the corresponding signal is transmitted on a same-numbered pin on the other connector. Similarly, for differential signals involving pairs of pins, the corresponding paired signals are transmitted and received on same-numbered pins on each connector.

Though the embodiments disclosed herein are preferred, additional embodiments, modifications and alternatives which do not part from the true scope of the invention may be apparent to those skilled in the art. Accordingly all such embodiments, modifications and alternatives are intended to be covered by the appended claims.

What is claimed is:

1. An interface device on a printed circuit board comprising:

a plurality of first pins for connecting to a first external device supporting a first interface standard;

a plurality of second pins for connecting to a second external device supporting a second interface standard;

a first signal line connected to a first one of said first pins and to a first one of said second pins;

a second signal line connected to a second one of said first pins and to a second one of said second pins;

a third signal line connected to a third one of said first pins and to a third one of said second pins; and a driver/receiver circuit having a first input connected to said first signal line for receiving respective signals in accordance with said first and second interface standards and an output connected to said second signal line for outputting respective signals in accordance with said first and second interface standards, said driver/receiver circuit having a second input connected to said third signal line for receiving respective differential signals on said first and said third signal line in accordance with said first and second interface standards.

2. An interface device on a printed circuit board comprising:

a plurality of first pins for connecting to a first external device supporting a first interface standard;

a plurality of second pins for connecting to a second external device supporting a second interface standard;

a first signal line connected to a first one of said first pins and to a first one of said second pins;

a second signal line connected to a second one of said first pins and to a second one of said second pins;

a third signal line connected to a third one of said first pins and to a third one of said second pins; and a driver/receiver circuit having an input connected to said first signal line for receiving respective signals in accordance with said first and second interface standards and a first output connected to said second signal line for outputting respective signals in accordance with said first and second interface standards, said driver/receiver circuit having a second output connected to said third signal line for outputting respective differential signals on said second and said third signal line in accordance with said first and second interface standards.

3. An interface device on a printed circuit board comprising:
- a plurality of first pins for connecting to a first external device supporting a first interface standard;
- a plurality of second pins for connecting to a second external device supporting a second interface standard;
- a first signal line connected to a first one of said first pins and to a first one of said second pins;
- a second signal line connected to a second one of said first pins and to a second one of said second pins;
- a third signal line connected to a third one of said first pins and to a third one of said second pins;
- a fourth signal line connected to a fourth one of said first pins and to a fourth one of said second pins;
- a first driver/receiver circuit having an input connected to said first signal line for receiving respective signals in accordance with said first and second interface standards and an output connected to said second signal line for outputting respective signals in accordance with said first and second interface standards; and
- a second driver/receiver circuit having an input connected to said third signal line for receiving respective signals in accordance with said first and second interface standards and an output connected to said fourth signal line for outputting respective signals in accordance with said first and second interface standards.

* * * * *